United States Patent [19]
Ishigami

[11] Patent Number: 6,097,094
[45] Date of Patent: Aug. 1, 2000

[54] SEMICONDUCTOR DEVICE HAVING WIRING LAYERS AND METHOD OF FABRICATING THE SAME

[75] Inventor: Takashi Ishigami, Tokyo, Japan

[73] Assignee: NEC Corporation, Tokyo, Japan

[21] Appl. No.: 08/936,018

[22] Filed: Sep. 23, 1997

[30] Foreign Application Priority Data

Sep. 26, 1996 [JP] Japan ................................. 8-254437

[51] Int. Cl.$^7$ ........................... H01L 23/48; H01L 23/52; H01L 29/40
[52] U.S. Cl. .......................... 257/763; 257/764; 257/765; 438/675
[58] Field of Search .................................. 257/758, 765, 257/760, 771, 763, 764, 774, 770; 438/636, 637, 688, 675

[56] References Cited

U.S. PATENT DOCUMENTS

| 4,670,967 | 6/1987 | Hazuki | 29/576 B |
| 4,917,759 | 4/1990 | Fisher et al. | 438/625 |
| 5,001,079 | 3/1991 | Van Laarhoven et al. | 257/774 |
| 5,380,679 | 1/1995 | Kano | 438/628 |
| 5,451,543 | 9/1995 | Woo et al. | 438/637 |
| 5,619,072 | 4/1997 | Mehta | 257/774 |
| 5,651,857 | 7/1997 | Cronin et al. | 438/696 |
| 5,702,981 | 12/1997 | Maniar et al. | 438/627 |
| 5,756,396 | 5/1998 | Lee et al. | 438/622 |
| 5,883,433 | 3/1999 | Oda | 257/750 |

FOREIGN PATENT DOCUMENTS

| 60-115245 | 6/1985 | Japan . |
| 3-131032 | 6/1991 | Japan . |
| 3-222333 | 10/1991 | Japan . |
| 6-29399 | 2/1994 | Japan . |
| 8-88227 | 4/1996 | Japan . |

OTHER PUBLICATIONS

Japanese Office Action dated Sep. 22, 1998 with English language translation of Japanese Examiner's comments.

Primary Examiner—Olik Chaudhuri
Assistant Examiner—Phat X. Cao
Attorney, Agent, or Firm—Whitham, Curtis & Whitham

[57] ABSTRACT

There is provided a semiconductor device including a lower wiring layer including a first layer containing aluminum therein and a second layer formed on the first layer, the second layer having an extended portion extending beyond an outer surface of the first layer, an interlayer insulating layer formed covering the lower wiring layer therewith, the interlayer insulating layer being formed with a hole including a first portion terminating at an upper surface of the second layer and a second portion passing the second layer but not reaching a bottom of the first layer, an electrically conductive material filling the hole therewith, and an upper wiring layer formed on the interlayer insulating film in electrical connection with the lower wiring layer through the electrically conductive material. The first layer is not exposed to the second portion of the hole because of the interlayer insulating layer existing under the extended portion of the second layer. Hence, it is possible to prevent aluminum contained in the first layer from being eroded during CVD carried out for forming a contact plug filling the hole therewith.

17 Claims, 5 Drawing Sheets

SEMICONDUCTOR DEVICE HAVING WIRING LAYERS AND METHOD OF FABRICATING THE SAME

BACKGROUND OF THE INVENTION

1. Field of the Invention

The invention relates to a semiconductor device having a plurality of wiring layers and also to a method of fabricating the same, and more particularly to an improvement in electrical connection between upper and lower wiring layers.

2. Description of the Related Art

With recent enhancement in integration of a semiconductor device, a width of a wiring layer and a diameter of a via-hole for electrically connecting upper and lower wiring layers to each other are made smaller and smaller. However, if a diameter of a via-hole is reduced down to half-micron level, it would be quite difficult or almost impossible to sufficiently fill the via-hole with aluminum by sputtering. As a result, it would be necessary to form a contact plug by filling a via-hole with refractory metal such as tungsten (W) by chemical vapor deposition (CVD).

FIG. 1 is a cross-sectional view of a conventional semiconductor device having a contact plug. Silicon dioxide films 2 formed at a surface of a p-type silicon substrate 1 for element isolation defines element formation regions therebetween. After a MOS transistor including a gate electrode 4 formed on the silicon substrate 1 with a gate oxide film 3 sandwiched therebetween, source and drain regions 5-1 and 5-2 formed at a surface of the silicon substrate 1 has been formed in one of the element formation regions, an interlayer insulating film 6 is deposited on the silicon substrate 1.

Then, contact holes 7-1 and 7-2 are formed throughout the interlayer insulating film 6. The contact holes 7-1 and 7-2 reach the source and drain regions 5-1 and 5-2, respectively. Then, contact plugs 8-1 and 8-2 are formed by filling the contact holes 7-1 and 7-2 with tungsten, respectively. As suggested in Japanese Unexamined Patent Publication No. 60-115245, the contact plugs 8-1 and 8-2 may be formed by depositing tungsten in the contact holes 7-1 and 7-2 by selective CVD, or by depositing tungsten all over the interlayer insulating film 6 so that the contact holes 7-1 and 7-2 are filled with tungsten, and then etching back tungsten.

Then, wirings 10-1 and 10-2 are formed on the interlayer insulating film 6. The wirings 10-1 has a multi-layered structure comprised of a titanium nitride film 9-1, an Al—Si—Cu alloy film 9-2, and a titanium nitride film 9-3. The wiring layer 10-2 has the same structure as that of the wiring 10-1. The multi-layered structure including an aluminum alloy film sandwiched between titanium nitride films ensures an enhanced electro-migration resistance, which is quite useful as the integration is enhanced. As an alternative, the wirings 10-1 and 10-2 may be made of a single layer film composed of Al—Si—Cu alloy.

As illustrated in FIG. 1, the wiring 10-2 is in most cases designed to have a partially increased width where the wiring 10-2 makes contact with the tungsten plug 8-2. This is because an upper surface of the tungsten plug 8-2 is entirely covered with the wiring 10-2.

However, the above-mentioned structure where an upper surface of the tungsten plug 8-2 is entirely covered with the wiring 10-2 would be a hindrance to enhancement in integration. To solve this problem, there has been suggested a so-called borderless via-hole illustrated in FIG. 2. In accordance with the borderless via-hole structure, a wiring 10A-2 is designed to have a width equal to or smaller than a diameter of the tungsten plug 8-2 even where the wiring 10A-2 makes contact with the tungsten plug 8-2. Hence, the wiring 10A-2 partially covers an upper surface of the tungsten plug 8-2.

The borderless via-hole structure provides a merit that when pattering is carried out for forming the wiring 10A-2 by means of etching which is capable of providing a greater selection ratio relative to tungsten, even if the wiring 10A-2 is not full alignment with the tungsten plug 8-2, it would be possible to avoid that the tungsten plug 8-2 is partially etched, though it would be impossible to decrease a contact area between the wiring 10A-2 and the tungsten plug 8-2.

There has been suggested a semiconductor device having a plurality of wiring layers, which utilizes the above-mentioned borderless via-hole structure and is suitable for higher integration. FIGS. 3A to 3C illustrate respective steps of fabricating such a semiconductor device.

There are formed a MOS transistor, an interlayer insulating film 6, contact holes 7-1 and 7-2, contact plugs 8-1 and 8-2, and lower wirings 10A-1 and 10A-2 each comprised of three films 9-1, 9-2 and 9-3 on a p-type silicon substrate 1 in the same manner as that of the semiconductor device having been explained with reference to FIG. 2. Then, as illustrated in FIG. 3A, a second interlayer insulating film 11 is deposited on a resultant. Then, there is formed a contact hole 12 in the interlayer insulating film 11 reaching the lower wiring 10A-2. The contact hole 12 has a diameter almost equal to a width of the lower wiring 10A-2. As illustrated, the hole 12 includes a first portion 12a terminating at an upper surface of the layer 9-3 of the lower wiring 10A-2 and a second portion 12b passing the layer 9-3 but not reaching a bottom of the layer 9-1.

Then, as illustrated in FIG. 3B, there is formed a tungsten plug 13 which fills the contact hole 12 therewith. Then, as illustrated in FIG. 3C, an upper wiring 15 is formed on the second interlayer insulating film 11. The upper wiring 15 has a three-layered structure including a titanium nitride film 14-1, an Al—Si—Cu alloy film 14-2, and a titanium nitride film 14-3.

The dimensional relationship between the contact hole 12 and the lower wiring 10A-2 is the same as the dimensional relationship between the wiring 10A-2 and the tungsten plug 8-2, but is opposite with respect to top and bottom. That is, the borderless via-hole structure is applied to the connection between the lower and upper wirings 10A-2 and 15 in the semiconductor device illustrated in FIGS. 3A to 3C. Thus, the illustrated semiconductor device could have smaller-sized elements and enhanced electro-migration resistance.

In the illustrated semiconductor device, it would be necessary for surely forming the contact hole 12 that the etching for forming the contact hole 12 is continued after an upper surface of the titanium nitride film 9-3 has appeared. Namely, the contact hole 12 needs to be over-etched. Since misregistration in patterning in photolithography between the contact hole 12 and the wiring 10A-2 is unavoidable, a sidewall of the Al—Si—Cu alloy film 9-2 of the wiring 10A-2 cannot avoid to be exposed to the second portion 12b of the contact hole 12.

If the tungsten plug 13 were formed with the sidewall of the Al—Si—Cu alloy film 9-2 being exposed to the second portion 12b of the contact hole 12, $WF_6$ gas used as a source gas in CVD reacts with aluminum contained in the Al—Si—Cu alloy film 9-2 to thereby produce insulating material. Accordingly, there is posed a problem that the wiring 10A-2 is eroded with the result of an increase in a wiring resistance and reduction in reliability.

SUMMARY OF THE INVENTION

It is an object of the present invention to provide a semiconductor device having a plurality of wiring layers and a method of fabricating the same both of which are capable of providing a contact plug for a borderless via-hole between upper and lower wiring layers.

In one aspect, there is provided a semiconductor device, including (a) a lower wiring layer including a first layer containing aluminum therein and a second layer formed on the first layer, the second layer having a portion extending beyond an outer surface of the first layer, (b) an interlayer insulating layer formed covering the lower wiring layer therewith, the interlayer insulating layer being formed with a hole reaching the lower wiring layer, (c) an electrically conductive material filling the hole therewith, and (d) an upper wiring layer formed on the interlayer insulating film in electrical connection with the lower wiring layer through the electrically conductive material.

There is further provided a semiconductor device, including (a) a lower wiring layer including a first layer containing aluminum therein and a second layer formed on the first layer, the second layer having an extended portion extending beyond an outer surface of the first layer, (b) an interlayer insulating layer formed covering the lower wiring layer therewith, the interlayer insulating layer being formed with a hole including a first portion terminating at an upper surface of the second layer and a second portion passing the second layer but not reaching a bottom of the first layer, the first layer being not exposed to the second portion of the hole because of the interlayer insulating layer existing under the extended portion of the second layer, (c) an electrically conductive material filling the hole therewith, and (d) an upper wiring layer formed on the interlayer insulating film in electrical connection with the lower wiring layer through the electrically conductive material.

It is preferable that the hole has a diameter almost equal to a width of the second layer. The hole may be designed to have a diameter smaller than a width of the second layer.

For instance, the first layer may be made of aluminum alloy. It is preferable that the second layer is made of refractory metal. For instance, the second layer may be designed to have a two-layer structure including a titanium nitride film and a titanium film. As an alternative, the second layer may be made of titanium tungsten.

It is preferable that the lower wiring layer may further include a third layer formed under the first layer, and made of the same material as that of the second layer.

The extended portion of the second layer may have any length. However, it is preferable that the extended portion of the second layer has a length equal to or smaller than 21% of a width of the first layer.

The electrically conductive material may be tungsten or aluminum.

There is still further provided a semiconductor device, including (a) a semiconductor substrate, (b) a gate electrode formed on the semiconductor substrate, and source and drain regions formed in the semiconductor substrate, the gate electrode, source and drain regions cooperate with one another to form a transistor, (c) a first interlayer insulating film formed on the semiconductor substrate, the first interlayer insulating film being formed with a first hole reaching one of the source and drain regions, (d) a first electrically conductive material filling the first hole therewith, (e) a lower wiring layer formed so as to partially cover the first electrically conductive material, the lower wiring layer including a first layer containing aluminum therein and a second layer formed on the first layer, the second layer having an extended portion extending beyond an outer surface of the first layer, (f) a second interlayer insulating layer formed covering the lower wiring layer therewith, the second interlayer insulating layer being formed with a second hole including a first portion terminating at an upper surface of the second layer and a second portion passing the second layer but not reaching a bottom of the first layer, the first layer being not exposed to the second portion of the second hole because of the second interlayer insulating layer existing under the extended portion of the second layer, (g) a second electrically conductive material filling the second hole therewith, and (h) an upper wiring layer formed on the second interlayer insulating film in electrical connection with the lower wiring layer through the second electrically conductive material.

In another aspect, there is provided a method of fabricating a semiconductor device, including the steps of (a) depositing a first layer including aluminum therein and a second layer made of refractory metal in this order on an insulating film formed on a semiconductor substrate, (b) forming a lower wiring layer by etching the first layer in such a way that the second layer has an extended portion extending beyond an outer surface of the first layer, (c) depositing an interlayer insulating film covering the lower wiring layer therewith, (d) forming a hole in the interlayer insulating film so that the hole reaches the second layer of the lower wiring layer, (e) filling the hole with electrically conductive material, and (f) forming an upper wiring layer on the interlayer insulating film in such a way that the upper wiring layer is in electrical connection with the lower wiring layer through the electrically conductive material.

It is preferable that the lower wiring layer is formed by isotropic etching in the step (b).

The step (e) may include the steps of (e-1) depositing electrically conductive material by chemical vapor deposition over the interlayer insulating film so that the hole is filled with the electrically conductive material, and (e-2) etching back the thus deposited electrically conductive material.

It is preferable that the interlayer insulating film is formed by bias-applied high-density plasma-enhanced chemical vapor deposition or by bias electron cyclotron resonant (ECR) chemical vapor deposition.

The second layer may include a titanium film and a titanium nitride film, in which case the first layer is subject to dry chemical etching using chlorine gas. As an alternative, the second layer may include a titanium tungsten film, in which case the first layer is subject to reactive ion etching using $BCl_3$ gas.

It is preferable that the first layer is etched by at least 0.02 $\mu$m in the step (b). The hole may be formed in the step (d) in such a way that the hole has a diameter almost equal to a width of the second layer. It is preferable that the hole is formed in the step (d) so as to have a first portion terminating at an upper surface of the second layer and a second portion passing the second layer but not reaching a bottom of the first layer, the first layer being not exposed to the second portion of the hole because of the interlayer insulating layer existing under the extended portion of the second layer.

It is preferable that a third layer is further deposited in the step (a) before the first layer is deposited, in which case the lower wiring layer is constituted of the third, first and second layers in this order from the bottom. The third layer may be made of the same material as that of the second layer.

There is still further provided a method of fabricating a semiconductor device, including the steps of (a) forming a transistor on a semiconductor substrate, the transistor including a gate electrode formed on the semiconductor substrate, and source and drain regions formed in the semiconductor substrate, (b) depositing a first interlayer insulating film over the semiconductor substrate, (c) forming a first hole in the first interlayer insulating film in such a way that the first hole reaches one of the source and drain regions, (d) filling the first hole with first electrically conductive material, (e) depositing a first layer including aluminum therein and a second layer made of refractory metal in this order on the first interlayer insulating film, (f) forming a lower wiring layer by etching the first and second layers in such a way that the lower wiring layer partially covers the first electrically conductive material and that the second layer has an extended portion extending beyond an outer surface of the first layer, (g) depositing a second interlayer insulating film covering the lower wiring layer therewith, (h) forming a second hole in the second interlayer insulating film so that the second hole includes a first portion terminating at an upper surface of the second layer and a second portion passing the second layer but not reaching a bottom of the first layer, the first layer being not exposed to the second portion of the second hole because of the second interlayer insulating layer existing under the extended portion of the second layer, (i) filling the second hole with a second electrically conductive material, and (j) forming an upper wiring layer on the second interlayer insulating film in such a way that the upper wiring layer is in electrical connection with the lower wiring layer through the second electrically conductive material.

In the above-mentioned semiconductor device in accordance with the present invention, the second layer of the lower wiring layer is formed so as to have the extended portion extending beyond an outer surface of the first layer. Since the interlayer insulating layer is deposited after the second layer has been formed, the interlayer insulating layer is deposited around the first layer and under the extended portion of the second layer. Accordingly, the first layer is not exposed to the hole, more particularly, the second portion of the hole. Thus, even if $WF_6$ gas is used for forming the contact plug, aluminum contained in the first layer is not exposed to $WF_6$ gas, and hence does not react with $WF_6$ gas. As a result, it would be possible to prevent that the first layer of the lower wiring produces insulating material by reacting with $WF_6$ gas.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

A method of fabricating a semiconductor device in accordance with the first embodiment is explained hereinbelow with reference to FIGS. 4A to 4E.

Figure 1:
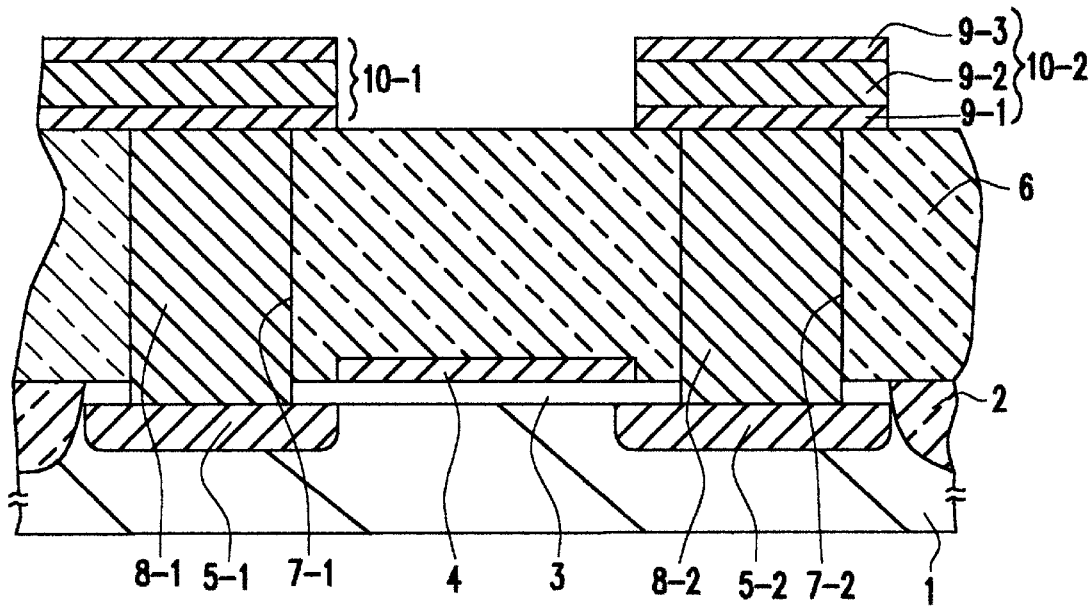
FIG. 1 is a cross-sectional view of a conventional semiconductor device.
Figure 2:
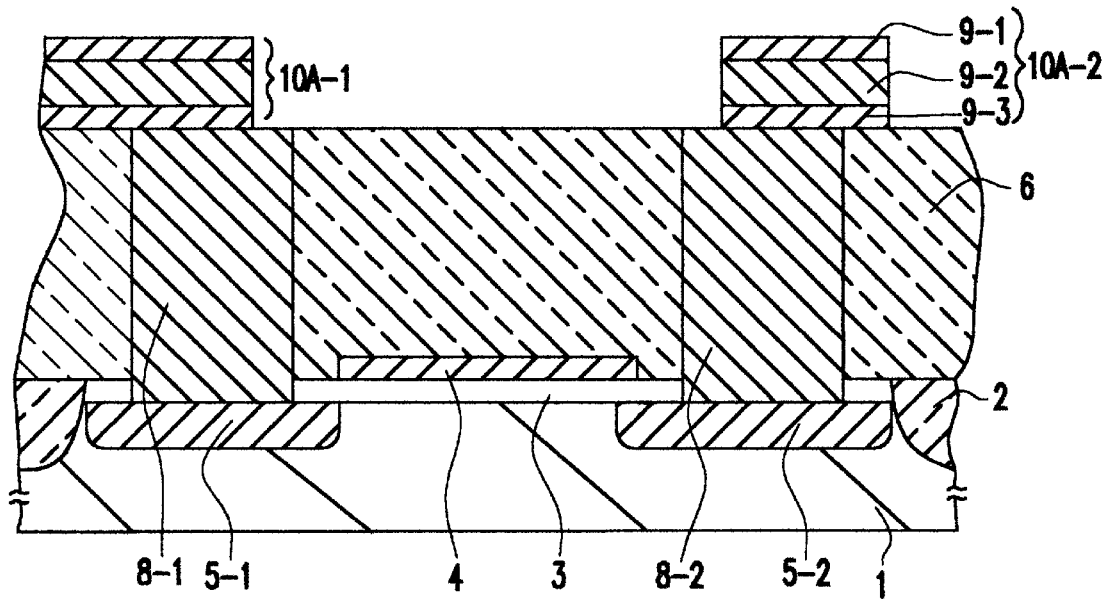
FIG. 2 is a cross-sectional view of another conventional semiconductor device.
Figure 3A:
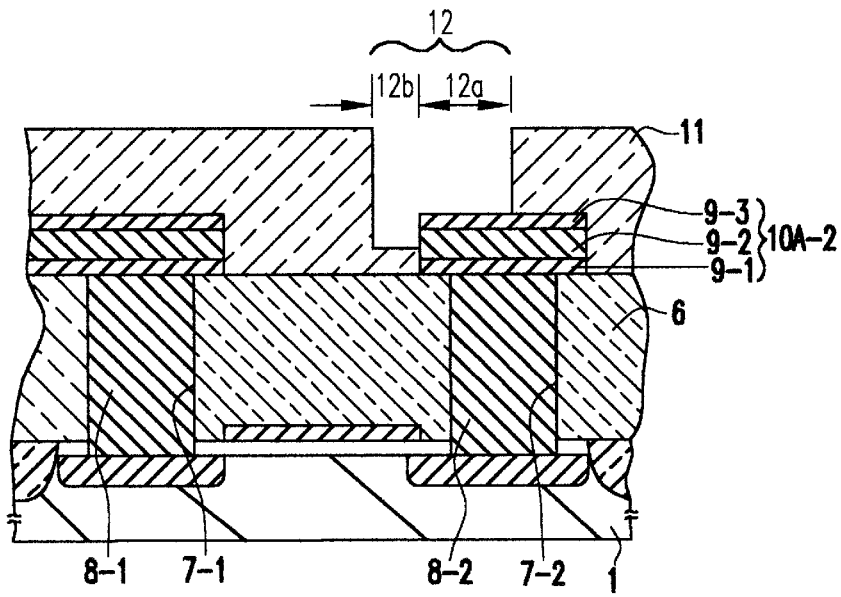
FIGS. 3A to 3C are cross-sectional views of a semiconductor device, illustrating respective steps of a method of fabricating the semiconductor device having a borderless via-hole formed on a wiring layer.
Figure 3B:
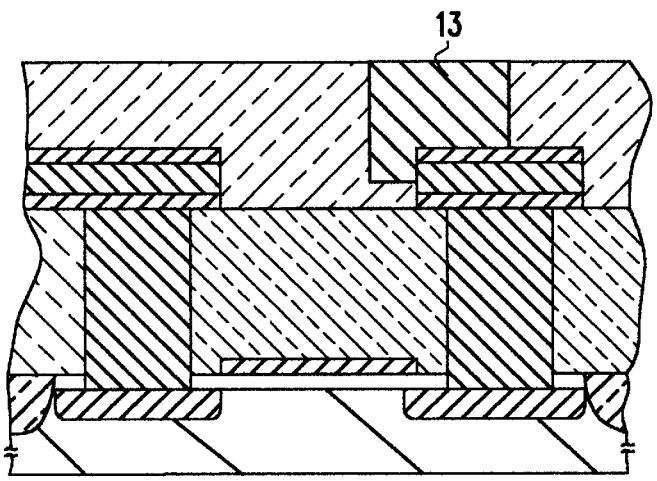
Figure 3C:
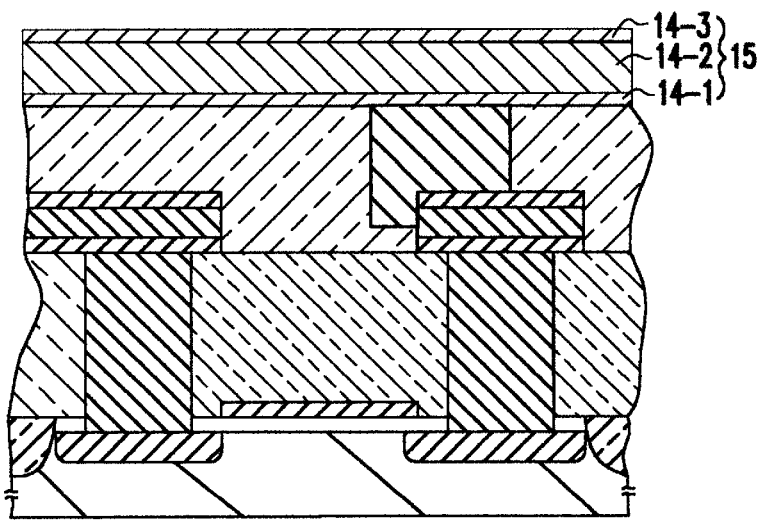
Figure 4A:
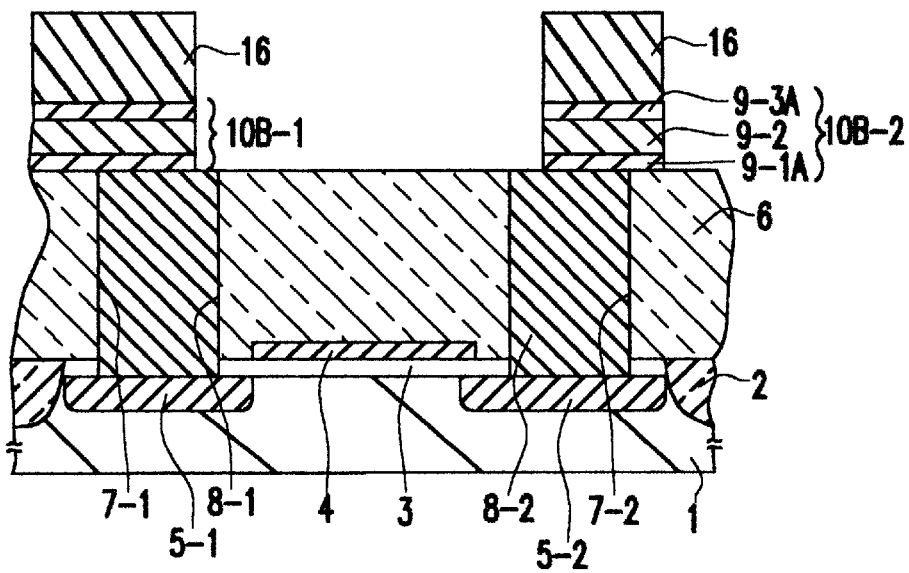
FIGS. 4A to 4E are cross-sectional views of a semiconductor device, illustrating respective steps of a method of fabricating the same in accordance with the first embodiment of the present invention.

With reference to FIG. 4A, there are formed silicon dioxide films 2 at a surface of a p-type silicon substrate 1 for device isolation. The silicon dioxide films 2 have a thickness of about 300 nm, and define device formation regions therebetween.

Then, after impurities such as phosphorus and boron have been ion-implanted into one of the device formation regions, there are formed a gate oxide film 3 and a polysilicon film on the p-type silicon substrate 1. Then, a gate electrode 4 is formed by patterning the polysilicon film. Then, impurities such as arsenic are ion-implanted into the silicon substrate 1, followed by annealing to thereby form source and drain regions 5-1 and 5-2 at a surface of the silicon substrate 1. Thus, there is completed a MOS transistor constituted of the gate electrode 4, and the source and drain regions 5-1 and 5-2.

Then, a silicon dioxide film 6 containing phosphorus and boron (BPSG film) is deposited by chemical vapor deposition (CVD) on the silicon substrate 1. The silicon dioxide film 6 acts as an interlayer insulating film. Then, contact holes 7-1 and 7-2 are formed through the interlayer insulating film 6 by means of photolithography and dry etching. Then, contact plugs 8-1 and 8-2 are formed by depositing tungsten in the contact holes 7-1 and 7-2 by selective CVD, or by depositing tungsten all over the interlayer insulating film 6 so that the contact holes 7-1 and 7-2 are filled with tungsten, and then etching back the thus deposited tungsten.

Then, there is formed a barrier metal 9-1A by sputtering on the interlayer insulating film 6. The barrier metal film 9-1A is comprised of a titanium film having a thickness of 30 nm and a titanium nitride film having a thickness of 100 nm.

Then, there is formed an aluminum alloy film 9-2 on the titanium nitride film 9-1A. The aluminum alloy film 9-2 contains copper by 0.5 weight %, and has a thickness of 450 nm. Then, there is formed a cap metal film 9-3A on the aluminum alloy film 9-2 for preventing improper patterning caused by light reflection at a ground layer in a light exposure step, and also for enhancement in reliability in wiring. The cap metal film 9-3A is comprised of a titanium film having a thickness of 25 nm and a titanium nitride film having a thickness of 100 nm.

Then, photoresist 16 is deposited all over the cap metal film 9-3A, and thereafter is patterned in a wiring layer pattern by photolithography. Then, the deposited layers 9-1A, 9-2 and 9-3A are patterned in a desired pattern by dry etching such as reactive ion etching (RIE) or helicon wave plasma-enhanced etching in both of which $BCl_3$ gas is employed, to thereby form lower wiring layers 10B-1 and 10B-2.

Figure 4B:
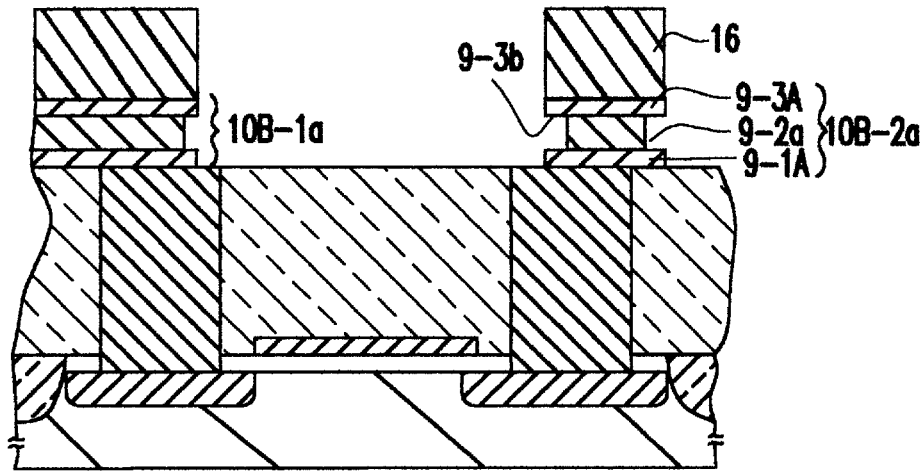

Then, as illustrated in FIG. 4B, chemical dry etching employing chlorine gas is carried out to the barrier metal film 9-1A and the cap metal film 9-3A to thereby reduce a width of the aluminum alloy film 9-2. Thus, a part of the aluminum alloy film 9-2 is selectively removed. Herein, the chemical dry etching is a micro-wave plasma etching where a reaction chamber is separate from a plasma generation chamber. Since only chlorine radical is used, the dry chemical etching is isotropic etching, and as a result the layers 9-1A and 9-3A made of titanium and titanium nitride are scarcely etched.

It is preferable that the aluminum alloy film 9-2 is etched by 30% or smaller of a width thereof for preventing an increase in a wiring resistance. Assuming that the wiring layer 10B-2 has a width of about half-micron, it is preferable that the aluminum alloy film 9-2 is etched totally by 0.15 $\mu$m or smaller, or by 0.075 $\mu$m or smaller at one of opposite sides. Thus, there is formed a wiring layer 10B-2a including the cap metal film 9-3A having extended portions 9-3b extending beyond an outer surface of the aluminum alloy layer 9-2. As mentioned earlier, the extended portions 9-3b are formed by etching the aluminum alloy layer 9-2 by 30% or smaller of a width thereof. This is equivalent to that each of the extended portions 9-3b of the wiring layer 10B-2a has a length equal to or smaller than 21% of a width of the aluminum alloy layer 9-2.

$$(0.3 \div (1.0-0.3)) \div 2 \times 100 \approx 21$$

After the patterned photoresist 16 has been removed, wet etching employing organic solvent is carried out to thereby remove aluminum fluoride having been produced in the above-mentioned dry etching.

Figure 4C:
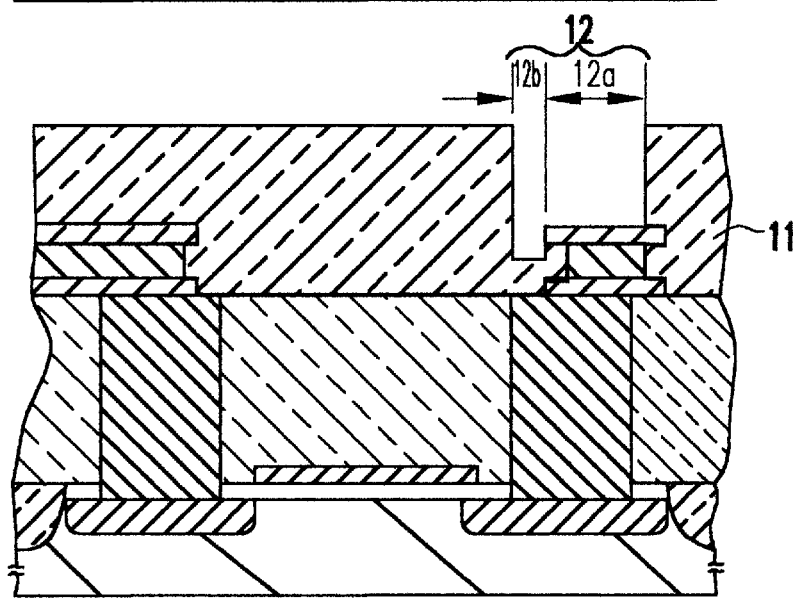

Then, as illustrated in FIG. 4C, a silicon dioxide film is formed as an interlayer insulating film 11 by bias-applied high density plasma-enhanced CVD, in particular by bias electron cyclotron resonant (ECR) CVD. In the instant embodiment, the interlayer insulating film 11 is formed under the following conditions.

Substrate temperature: 70° C.

RF bias power: 1.4 kW (13.56 MHz)

Micro-wave power: 2 kW (2.54 GHz)

Pressure: 0.2 Pa $SiH_4$ flow rate: 40 sccm $O_2$ flow rate: 64 sccm

Ar flow rate: 70 sccm

By employing ECR-CVD, the silicon dioxide film 11 can be deposited with excellent step coverage, resulting in that a space defined around the width-reduced aluminum alloy layer 9-2a and between the extended portions of both the layers 9-1A and 9-3A is sufficiently filled with the silicon dioxide film 11.

Then, the interlayer insulating film 11 is planarized by chemical and mechanical polishing (CMP), followed by dry etching such as reactive ion etching (RIE) employing $CHF_3$ or $CF_4$ with a patterned photoresist film (not illustrated) used as a mask, to thereby form a contact hole 12. The contact hole 12 is designed to have a diameter almost equal to a width of the wiring layer 10B-2, namely a width of the cap metal film 9-3A. Hence, if there would be misregistration between the contact hole 12 and the wiring layer 10B-2 in photolithography, the silicon dioxide film 11 is over-etched. As a result, as illustrated in FIG. 4C, the contact hole 12 is formed to have a first portion 12a terminating at an upper surface of the cap metal layer 9-3A and a second portion 12b passing the cap metal layer 9-3A but not reaching a bottom of the aluminum alloy film 9-2a. Since the space defined around the width-reduced aluminum alloy film 9-2a and below the extended portion 9-3b of the cap metal layer 9-3A is filled with the interlayer insulating film 11, the aluminum alloy film 9-2a is not exposed to the contact hole 12, more particularly, to the second portion 12b of the contact hole 12.

Since the dry etching such as RIE for the formation of the contact hole 12 is anisotropic etching, the interlayer insulating film 11 is scarcely etched horizontally. However, it is preferable that the aluminum alloy film 9-2 is etched by at least 0.02 $\mu$m for ensuring the formation of the extended portion 9-3b of the cap metal layer 9-3A.

Figure 4D:
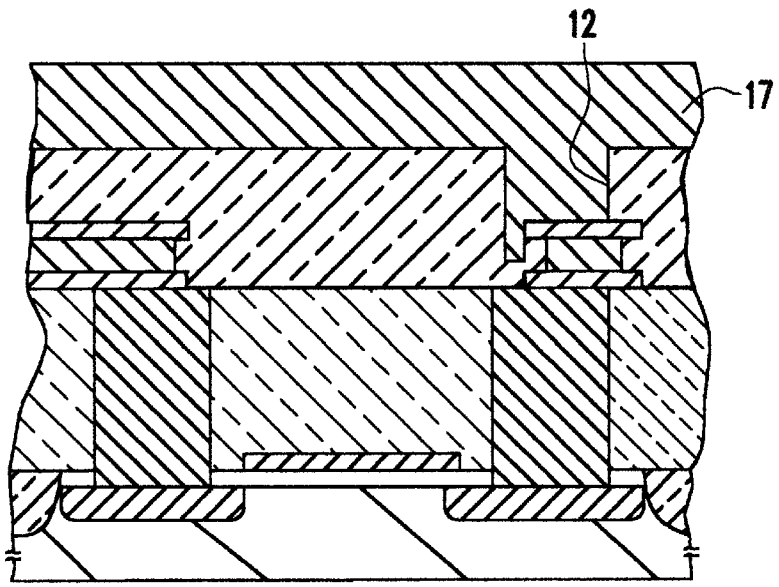
Figure 4E:
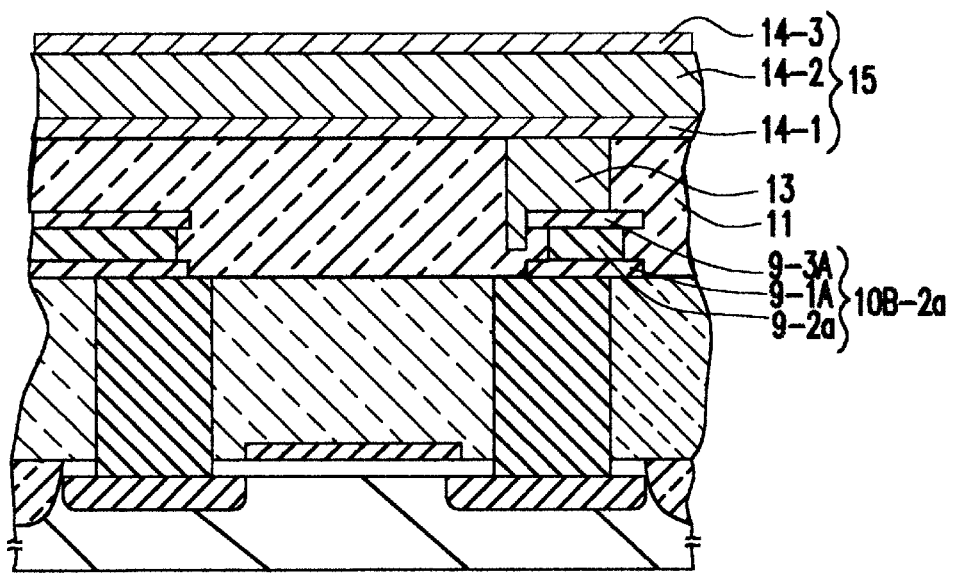

Then, as illustrated in FIG. 4D, a tungsten film 17 is deposited all over the interlay insulating film 11 and the contact hole 12 by CVD employing $WF_6$ gas. Thus, the contact hole 12 is filled with tungsten. Then, the tungsten film 17 is etched back, namely is removed by anisotropic dry etching to thereby leave the tungsten film 17 only in the contact hole 12, as illustrated in FIG. 4E. Thus, there is formed a tungsten plug 13.

Thereafter, a barrier metal film 14-1, an aluminum alloy film 14-2 and a cap metal film 14-3 are successively formed by sputtering on the interlayer insulating film 11 in the same way as the wiring layer 10B-2, followed by deposition of photoresist, patterning the photoresist by photolithography, and dry etching with the patterned photoresist used as a mask, to thereby form an upper wiring layer 15, as illustrated in FIG. 4E.

Since the width-reduced aluminum alloy film 9-2a is covered with the silicon dioxide film 11, when the tungsten film 17 is made grown all over the substrate by CVD to thereby fill the contact hole 12 with the tungsten film, it is ensured that the aluminum alloy film 9-2a is not exposed to the $WF_6$ source gas. Thus, it would be possible to prevent generation of insulating material.

In addition, since the lower wiring layer 10B-2 is designed to have a multi-layered structure including the cap metal film 9-3A, as a topmost layer, comprised of two films; a titanium nitride film and a titanium film, it would be possible to obtain enhanced accuracy in dimension in a light exposure step and enhanced electro-migration resistance.

Japanese Unexamined Patent Publication No. 3-131032 has suggested a semiconductor device having a multi-layered wiring layer similar to the wiring layer 10B-2a illustrated in FIGS. 4B to 4E. However, the multi-layered wiring layer suggested in the above-mentioned Publication is for the sake of preventing generation of voids in an interlayer insulating film by reducing a diameter of a layer corresponding to the aluminum alloy layer 9-2 to thereby enlarge a space between the layers. The above-mentioned Publication does not indicate and suggest the combination of the wiring layer and the borderless via-hole, and the problem accompanied with the combination.

Figure 5:
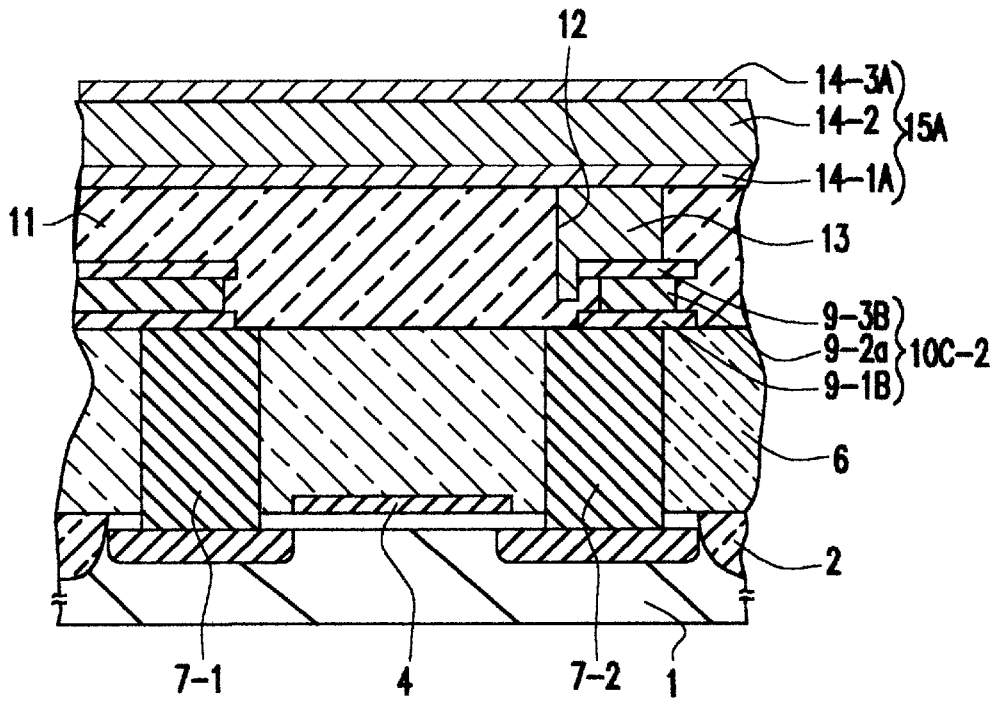
FIG. 5 is a cross-sectional view of a semiconductor device in accordance with the second embodiment of the present invention.

FIG. 5 illustrates a semiconductor device in accordance with the second embodiment of the invention. The illustrated semiconductor device is different from the above-mentioned semiconductor device in accordance with the first embodiment in that a barrier metal film 9-1B and a cap metal film 9-3B in a lower wiring layer 10C-2 and a barrier metal film 14-1A and a cap metal film 14-3A in an upper wiring layer 15A are made of titanium tungsten (TiW) and have a thickness of 100 nm.

Hereinbelow is explained a method of fabricating the semiconductor device in accordance with the second embodiment. The method has the same steps as the step of forming the BPSG film 6 on the silicon substrate 1 and the steps to be carried out before. After the BPSG film 6 has been formed on the silicon substrate 1 by CVD, a titanium tungsten film as the barrier metal film 91B is formed on the BPSG film 6 by 100 nm. Then, an aluminum alloy film containing copper by 0.5 weight % is formed on the titanium tungsten film 9-1B by 450 nm. Thereafter, a titanium tungsten film as the cap metal film 9-3B is formed on the aluminum alloy film by 100 nm.

Then, there is formed a photoresist film having a wiring pattern. Then, the titanium tungsten film 9-1B, the aluminum alloy film and the titanium tungsten film 9-3B are patterned by three steps reactive ion etching with the patterned photoresist film being used as a mask. In the first step etching, the barrier metal film or titanium tungsten film 9-3B is etched employing $SF_6$ gas.

In the second step, the aluminum alloy film is etched employing $BCl_3$ gas. In this second step etching, the lower and upper titanium tungsten films 91B and 9-3B are not etched, because selectivity of titanium tungsten to aluminum is equal to or greater than 10. Hence, the second step etching is continued after an upper surface of the titanium tungsten film 9-1B has appeared, in other words, the aluminum alloy film is over-etched, to thereby make the aluminum alloy film have a smaller width than that of the cap metal film 9-3B. Thus, there are formed the cap metal film 9-3B having extended portions extending beyond an outer surface of the aluminum alloy film 9-2a, and an aluminum alloy film 9-2a having a smaller width than the cap metal film 9-3B.

In the third step etching, the lower barrier metal film 9-1B is etched employing $SF_6$ gas. Thus, there is formed a lower wiring layer 10C-2 including the titanium tungsten film 9-1B, the aluminum alloy film 9-2a, and the titanium tungsten film 9-3B.

Thereafter, a silicon dioxide film as an interlayer insulating film 11 is deposited over the lower wiring layer 10C-2 and the BPSG film 6 by bias ECR-CVD providing excellent step coverage. The thus deposited interlayer insulating film 11 is planarized by CMP, followed by dry etching such as reactive ion etching (RIE) employing $CHF_3$ or $CF_4$ with a patterned photoresist film (not illustrated) used as a mask, to thereby form a contact hole or borderless via-hole 12. The contact hole 12 is designed to have a diameter almost equal to a width of the cap metal film 9-3B. Similarly to the first embodiment, the contact hole or borderless via-hole 12 includes a first portion (no reference numeral) terminating at an upper surface of the cap metal layer 9-3B and a second portion (no reference numeral) passing the cap metal layer 9-3B but not reaching a bottom of the aluminum alloy film 9-2a. Since a space defined around the width-reduced aluminum alloy film 9-2a and below the extended portion of the cap metal layer 9-3B is filled with the interlayer insulating film 11, the aluminum alloy film 9-2a is not exposed to the contact hole 12.

After the silicon dioxide film 11 has been pre-processed with $BCl_3$ gas, a tungsten film is grown only over the lower wiring layer 10C-2 by CVD employing $WF_6$ and $SiH_4$ as source gases. Thus, there is formed a tungsten plug 13 filling the contact hole 12 therewith. Thereafter, an upper wiring layer 15A is formed in the same way as the lower wiring layer 10C-2.

In accordance with the second embodiment, the aluminum alloy film can be etched with high selectivity to the titanium tungsten or cap metal film 93B. Hence, the cap metal film 9-3A having the extended portion can be reproduced with high accuracy. In addition, since tungsten can be made selectively grown in the contact hole 12, it would be not necessary to carry out etching back the tungsten film unlike the first embodiment where a step of etching back a tungsten film has to be carried out because tungsten is deposited entirely over the interlayer insulating film, ensuring the smaller number of steps.

Figure 6:
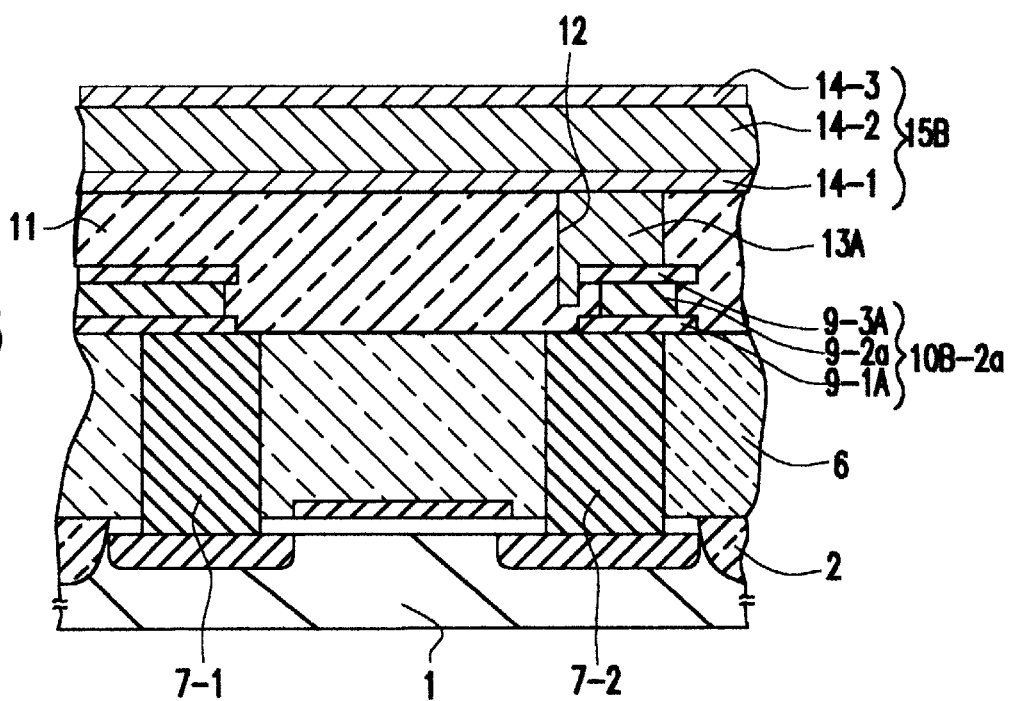
FIG. 6 is a cross-sectional view of a semiconductor device in accordance with the third embodiment of the present invention.

FIG. 6 illustrates a semiconductor device in accordance with the third embodiment of the present invention.

The illustrated semiconductor device is different from the semiconductor device in accordance with the first embodiment in that an aluminum plug 13A is used in place of the tungsten plug 13. The aluminum plug 13A is formed by depositing aluminum all over the interlayer insulating film 11 by CVD employing $AlCl_3$ as a source gas, and etching back the thus deposited aluminum. Though $AlCl_3$ gas reacts with aluminum like $WF_6$ gas, there is not posed a problem of generation of insulating material caused by reaction of aluminum with the source gas, because the width-reduced aluminum alloy film 9-2a of a lower wiring layer 10B-2a is not exposed to the contact hole 12 due to the interlayer insulating film 11 filling a space defined around the width-reduced aluminum alloy film 9-2a and below the extended portion of the cap metal film 93A.

The contact hole 12 is in borderless relation with the lower wiring layer 10B-2a. However, it is not appropriate that the contact hole 12 is formed in borderless relation with the upper wiring layer 15B. However, if the upper wiring layer 15B were a topmost wiring layer and needed to have a wider wiring width like a power source wiring or a ground wiring, it would not be necessary to form the upper wiring layer 15B in a borderless structure, and hence there are not posed any problems, even if the contact hole 12 is not formed in borderless relation with the upper wiring layer 15B. To the contrary, a contact plug having a smaller resistance could be preferably formed.

While the present invention has been described in connection with the preferred embodiments, the semiconductor device and method of fabricating the same provides advantages as follows.

Firstly, the invention prevents the aluminum alloy film from being eroded when a contact plug is formed by using source gases such as $WF_6$ gas, because the aluminum alloy layer 9-2a is made to have a smaller width than the cap metal layer 9-3A, 9-3B, and a space defined around the width-reduced aluminum alloy layer 9-2a and below the extended portion of the cap metal layer 9-3A, 9-3B is filled with the interlayer insulating layer 11, ensuring that the aluminum alloy film 9-2a is not exposed to the contact hole 12, even when the contact hole 12 is formed in a borderless structure. As a result, it would be possible to accomplish multi-layered wirings having enhanced reliability and enhanced electro-migration resistance.

Secondly, the ability of employing the borderless structure ensures enhancement in integration in a semiconductor device having a plurality of wiring layers. The reason is that a contact plug is absolutely necessary to be formed for the formation of a contact hole at a sub-half micron level in order to prevent wire breakage which would be caused by shortage of step coverage for the aluminum alloy film, and that a borderless via-hole structure for a lower wiring layer is required to form for enhancing designability in a semiconductor device having a plurality of wiring layers, and also for accomplishing higher integration.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 8-254437 filed on Sep. 26, 1996 including specification, claims, drawings and summary is incorporated herein by reference in its entirety.

What is claimed is:

1. A semiconductor device, comprising:
   (A) a lower wiring layer including a first layer containing aluminum therein and a second layer formed on said first layer, said first layer having a narrower width than said second layer such that said second layer has an extended portion extending beyond an outer surface of said first layer in a width dimension;
   (B) an interlayer insulating layer positioned adjacent to and over said lower wiring layer, said interlayer insulating layer having a hole with a first portion extending from a top surface of said interlayer insulating layer to an upper surface of said second layer and a second portion extending from said top surface of said interlayer insulating layer beyond said second layer but not reaching a bottom of said first layer, a portion of said interlayer insulating layer abutting against said outer surface of said first layer of said lower wiring layer and being positioned under said extended portion of said second layer which extends beyond said outer surface of said first layer in said width dimension;
   (C) an electrically conductive material filling said hole, said portion of said interlayer insulating layer abutting against said outer surface of said first layer of said lower wiring layer preventing contact between said electrically conductive material and said first layer of said lower wiring layer; and
   (D) an upper wiring layer formed on said interlayer insulating film in electrical connection with said lower wiring layer through said electrically conductive material.

2. The semiconductor device as set forth in claim 1, wherein said hole has a diameter almost equal to a width of said second layer.

3. The semiconductor device as set forth in claim 1, wherein said first layer is made of aluminum alloy.

4. The semiconductor device as set forth in claim 1, wherein said second layer is made of refractory metal.

5. The semiconductor device as set forth in claim 4, wherein said second layer has a two-layer structure including a titanium nitride film and a titanium film.

6. The semiconductor device as set forth in claim 4, wherein said second layer is made of titanium tungsten.

7. The semiconductor device as set forth in claim 1, wherein said lower wiring layer further includes a third layer formed under said first layer, and made of the same material as that of said second layer.

8. The semiconductor device as set forth in claim 1, wherein said extended portion of said second layer has a length equal to or smaller than 21% of a width of said first layer.

9. The semiconductor device as set forth in claim 1, wherein said electrically conductive material is tungsten.

10. The semiconductor device as set forth in claim 1, wherein said electrically conductive material is aluminum.

11. A semiconductor device, comprising
    (A) a semiconductor substrate;
    (B) a gate electrode formed on said semiconductor substrate, and source and drain regions formed in said semiconductor substrate, said gate electrode, source and drain regions cooperate with one another to form a transistor;
    (C) a first interlayer insulating film formed on said semiconductor substrate, said first interlayer insulating film being formed with a first hole reaching one of said source and drain regions;
    (D) a first electrically conductive material filling said first hole therewith;
    (E) a lower wiring layer formed so as to partially cover said first electrically conductive material, said lower wiring layer including a first layer containing aluminum therein and a second layer formed on said first layer, said first layer having a narrower width than said second layer such that said second layer has an extended portion extending beyond an outer surface of said first layer in a width dimension;
    (F) a second interlayer insulating layer positioned adjacent to and over said lower wiring layer, said second interlayer insulating layer having a second hole having a first portion extending from a top surface of said interlayer insulating layer to an upper surface of said second layer and a second portion extending from said top surface of said interlayer insulating layer beyond said second layer but not reaching a bottom of said first layer, a portion of said interlayer insulating layer abutting against said outer surface of said first layer of said lower wiring layer and being positioned under said extended portion of said second layer which extends beyond said outer surface of said first layer in said width dimension;
    (G) a second electrically conductive material filling said second hole; and
    (H) an upper wiring layer formed on said second interlayer insulating film in electrical connection with said lower wiring layer through said second electrically conductive material.

12. The semiconductor device as set forth in claim 11, wherein said second hole has a diameter almost equal to a width of said second layer.

13. The semiconductor device as set forth in claim 11, wherein said second layer is made of refractory metal.

14. The semiconductor device as set forth in claim 13, wherein said second layer has a two-layer structure including a titanium nitride film and a titanium film.

15. The semiconductor device as set forth in claim 13, wherein said second layer is made of titanium tungsten.

16. The semiconductor device as set forth in claim 11, wherein said lower wiring layer further includes a third layer formed under said first layer, and made of the same material as that of said second layer.

17. The semiconductor device as set forth in claim 11, wherein said extended portion of said second layer has a length equal to or smaller than 21% of a width of said first layer.

* * * * *